(12) United States Patent
Matsuura

(10) Patent No.: US 6,891,575 B2
(45) Date of Patent: May 10, 2005

(54) REDUCED NOISE DIGITAL TUNER

(75) Inventor: Syuuji Matsuura, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 472 days.

(21) Appl. No.: 09/975,997

(22) Filed: Oct. 15, 2001

(65) Prior Publication Data

US 2002/0057379 A1 May 16, 2002

(30) Foreign Application Priority Data

Nov. 14, 2000 (JP) ........................................ 2000-346262

(51) Int. Cl.[7] ............................................... H04N 5/50
(52) U.S. Cl. ..................... 348/731; 348/732; 455/188.1
(58) Field of Search ................................ 348/731, 732, 348/729; 725/70, 111, 131, 139, 151; 455/188.1, 188.2, 189.1, 191.1, 191.2, 195.1, 196.1, 197.1, 197.2, 199.1, 142, 143

(56) References Cited

U.S. PATENT DOCUMENTS

| | | | |
|---|---|---|---|
| 5,212,828 A | | 5/1993 | Hatashita et al. |
| 5,345,504 A | * | 9/1994 | West, Jr. ..................... 380/205 |
| 5,521,650 A | * | 5/1996 | Ku .............................. 348/731 |
| 5,815,218 A | * | 9/1998 | Maeda ........................ 348/724 |
| 5,867,771 A | | 2/1999 | Ruitenburg |
| 6,044,251 A | * | 3/2000 | Brekelmans .............. 455/150.1 |
| 6,131,023 A | * | 10/2000 | Matsuura ..................... 455/301 |
| 6,405,025 B1 | * | 6/2002 | Keski-Mattinen ........... 455/266 |

FOREIGN PATENT DOCUMENTS

| | | |
|---|---|---|
| EP | 0 911 962 | 4/1999 |
| EP | 1 047 192 | 10/2000 |
| WO | WO 97/25781 | 7/1997 |

* cited by examiner

Primary Examiner—Victor R. Kostak
(74) Attorney, Agent, or Firm—Nixon & Vanderhye, PC

(57) ABSTRACT

A received signal passed through an HPF is supplied to an input switching circuit where the signal is switched to any of HIGH BAND, MID BAND and LOW BAND circuitry. The received signal of each band circuitry is band-switched by an RF amplification input BPF, RF-amplified by an RF amplifier and then a resultant received signal is supplied from an RF amplification output BPF. The received signal is mixed with a local oscillation signal from a local oscillator circuit by a mixer circuit to generate an intermediate-frequency signal. The intermediate-frequency signal is supplied to a first IF amplifier circuit, a SAW filter and a second IF amplifier circuit. A PLL channel select circuit outputs a switching voltage for each band and conduct PLL control for the local oscillator circuit.

5 Claims, 4 Drawing Sheets

REDUCED NOISE DIGITAL TUNER

BACKGROUND OF THE INVENTION

1. Field of the Invention

The present invention relates to a digital signal receiving tuner and particularly to a digital signal receiving tuner receiving digital television broadcast signals.

2. Description of the Background Art

With respect to cable television (CATV), introduction of HFC (Hybrid Fiber Coax) is now proceeding that includes coaxial cables as CATV drop wires to respective homes and a trunk network formed of optical fibers. HFC is introduced with the purpose of providing a broadband data communication service to each home with the rate of several M bits/sec. With 64 QAM (Quadrature Amplitude Modulation), a high-speed data line can be produced having a bandwidth of 6 MHz and a transmission rate of 30 Mbits/sec where a cable modem is used. Any empty channel of the cable television system can be utilized to achieve high-speed data communication at the rate from 4 Mbits/sec to 27 Mbits/sec.

A digital set-top box (STB) is a tuner for CATV. The cable modem allows a downstream data signal transmitted from a CATV station to be displayed on a television monitor, while the STB allows a downstream data signal from the CATV station that has been modulated by QPSK (Quadrature Phase Shift Keying) to branch from the tuner so that the signal is processed by a CPU to be output to a personal computer. The cable modem thus transmits a downstream data signal over an empty channel of CATV with a band extending from 54 MHz to 860 MHz while the STB uses frequencies in another band extending from 70 MHz to 130 MHz.

Current ground wave analogue television broadcasts are delivered by using both of the VHF and UHF bands. Three types of digital television broadcastings have globally been started in 1998–2000. In Japan, a full-scale ground wave digital broadcasting will be started through the UHF band in 2003. For almost all input streams for digital broadcasting to the STB, MPEG-2 is used. For outputs of the digital STB, television receivers are used regardless of ground wave broadcasting, satellite broadcasting and cable television broadcasting. Thus, the digital STB generally has the same structure.

On the other hand, according to types of services and service providers, different front-end circuits, CA (Conditional Access) systems, software types depending on the system of data broadcasting service, digital interfaces for connection with external equipment and the like are used.

FIG. 4 is a schematic block diagram of a conventional cable modem. Referring to FIG. 4, a received signal is supplied to a high-pass filter (HPF) 1 serving as an IF filter where low-frequency components are eliminated and then the signal is supplied to input switching circuits 2, 14 and 22 to be switched to HIGH BAND, MID BAND and LOW BAND. HPF 1 has an attenuation range from 5 to 42 MHz and a pass band of 54 MHz or higher. HIGH BAND, MID BAND and LOW BAND correspond respectively to bands of 470–860 MHz, 170–470 MHz and 54–170 MHz. However, respective ranges are not particularly limited to the specific examples above.

In general, input switching circuits 2, 14 and 22 are switching circuits formed of switching diodes or band division filters for switching. Each band enters an operating state according to a received channel so that other bands do not operate. Specifically, when a channel of HIGH BAND is received, the UHF band is selected so that HPF 1, input switching circuit 2, a radio frequency (RF) amplification input tuning circuit 3, an RF amplifier 4, an RF amplification output tuning circuit 5, a mixer circuit 6, a local oscillator circuit 7, an IF amplifier circuit 19, a SAW (surface acoustic wave) filter 20, an IF amplifier circuit 21 and a PLL (phase-locked loop) channel select circuit 27 operate, and remaining MID BAND (VHF HIGH BAND) circuits namely input switching circuit 14—mixer circuit 18 and a local oscillator circuit 13 as well as LOW BAND (VHF LOW BAND) circuits namely input switching circuit 22—mixer circuit 26 and a local oscillator circuit 8 stop operating.

Similarly, when a MID BAND channel is received, HPF 1, input switching circuit 14, RF amplification input tuning circuit 15, RF amplifier 16, RF amplification output tuning circuit 17, mixer circuit 18, local oscillator circuit 13, IF amplifier circuit 19, SAW filter 20, IF amplifier circuit 21 and PLL channel select circuit 27 operate while input switching circuit 2—mixer circuit 6, local oscillator circuit 7, input switching circuit 22—mixer circuit 26 and local oscillator circuit 8 stop operating.

When a LOW BAND channel is received, HPF 1, input switching circuit 22, RF amplification input tuning circuit 23, RF amplifier 24, RF amplification output tuning circuit 25, mixer circuit 26, local oscillator circuit 8, IF amplifier circuit 19, SAW filter 20, IF amplifier circuit 21 and PLL channel select circuit 27 operate while input switching circuit 2—mixer circuit 6, local oscillator circuit 7, input switching circuit 14—mixer circuit 18, and local oscillator circuit 13 stop operating.

Operations are carried out successively by transmitting channel select data from a CPU (not shown) to PLL channel select circuit 27, a channel is then selected and simultaneously, the band switching circuit operates in accordance with band information. Power supply to circuitry for each band is switched by the band switching circuit and each function is controlled accordingly.

The cable modem operates as described below. A received signal is passed through HPF 1 via an input terminal 11. Input switching circuits 2, 14 and 22 switch the signal to any band circuitry and RF amplification input tuning circuits 3, 15 and 23 select a channel. Then, the RF signal of its corresponding channel is amplified by RF amplifiers 4, 16 and 24, and the RF signal is tuned by RF amplification output tuning circuits 5, 17 and 25 and thus the received signal is output.

Mixer circuits 6, 18 and 26 and local oscillator circuits 7, 13 and 8 convert the frequency of the corresponding RF signal output from RF amplification output tuning circuits 5, 17 and 25 into the intermediate frequency to generate an intermediate-frequency signal to be supplied to IF amplifier circuit 19. The intermediate-frequency signal is passed through SAW filter 20 and amplified again by IF amplifier circuit 21 to be output from an output terminal 12.

For the conventional cable modem shown in FIG. 4, tracking adjustments are necessary in RF amplification input tuning circuits 3, 15 and 23, RF amplification output tuning circuits 5, 17 and 25 and local oscillator circuits 7, 13 and 8. The adjustments are required for each of HIGH BAND, MID BAND and LOW BAND.

Specifically, the tracking adjustments should be made by using air-core coils for resonance inductors of RF amplification input tuning circuits 3, 15 and 23, RF amplification output tuning circuits 5, 17 and 25 and local oscillator circuits 7, 13 and 8 each, so that the frequency is variable. The adjustments are necessary for each of HIGH BAND, MID BAND and LOW BAND, resulting in a longer adjustment time and a higher operation cost.

The air-core coils included in local oscillator circuits 7, 13 and 8 are each fixed to a substrate for example by adhesive or the like. In order to confirm the fixed state of the coils, the cable modem is lightly struck by a rubber hammer. A problem then arises that shock noise is generated due to frequency change caused by vibration of the struck air-core coils and noise is further generated by piezoelectric effect generated from a chip-type ceramic capacitor because of the striking.

SUMMARY OF THE INVENTION

One object of the present invention is accordingly to provide a digital signal receiving tuner which can dispense with tracking adjustments and reduce noise generation as much as possible.

In summary, the present invention is a tuner receiving digital signals of a plurality of frequency bands. The tuner includes an input circuit receiving the signals of a plurality of frequency bands, an input selector circuit receiving the signals from the input circuit to divide the received signals into a plurality of groups according to the frequency bands and selecting and outputting the received signals, a radio-frequency amplification input filter circuit supplied with a band-switching voltage for extracting a received signal of a corresponding frequency band from the received signals supplied from the input circuit, a radio-frequency amplifier circuit for radio-frequency-amplifying the received signal supplied from the radio-frequency amplification input filter circuit, a radio-frequency amplification output filter circuit supplied with the band-switching voltage for selectively outputting a radio-frequency signal of a predetermined band among radio-frequency signals supplied from the radio-frequency amplifier circuit, an oscillator circuit having a phase-locked loop for supplying the band-switching voltage and outputting a local oscillation signal for each frequency band, a mixer circuit mixing the radio-frequency signal selected by the radio-frequency amplification output filter circuit and the local oscillation signal from the oscillator circuit to output an intermediate-frequency signal.

Tracking adjustments are thus unnecessary without considerable change of the conventional tuner circuit structure. Moreover, no variable inductor made of an air-core coil may be used since tracking adjustments are unnecessary. Then, a fixed inductor can be used to constitute a filter circuit.

Preferably, the radio-frequency amplification input filter circuit and the radio-frequency amplification output filter circuit include a bandpass filter.

More preferably, the radio-frequency amplification input filter circuit includes a bandpass filter and the radio-frequency amplification output filter circuit includes a low-pass filter.

Still more preferably, the oscillator circuit includes a voltage-controlled oscillator provided correspondingly to each frequency band for outputting a corresponding local oscillation signal, and a phase-locked loop circuit constituting a phase-locked loop together with each voltage-controlled oscillator.

Each voltage-controlled oscillator and the filter circuit are thus structured separately so that tracking adjustments are not required.

Still more preferably, the phase-locked loop circuit includes a loop filter formed of a strontium ceramic capacitor.

Microphonics can accordingly be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
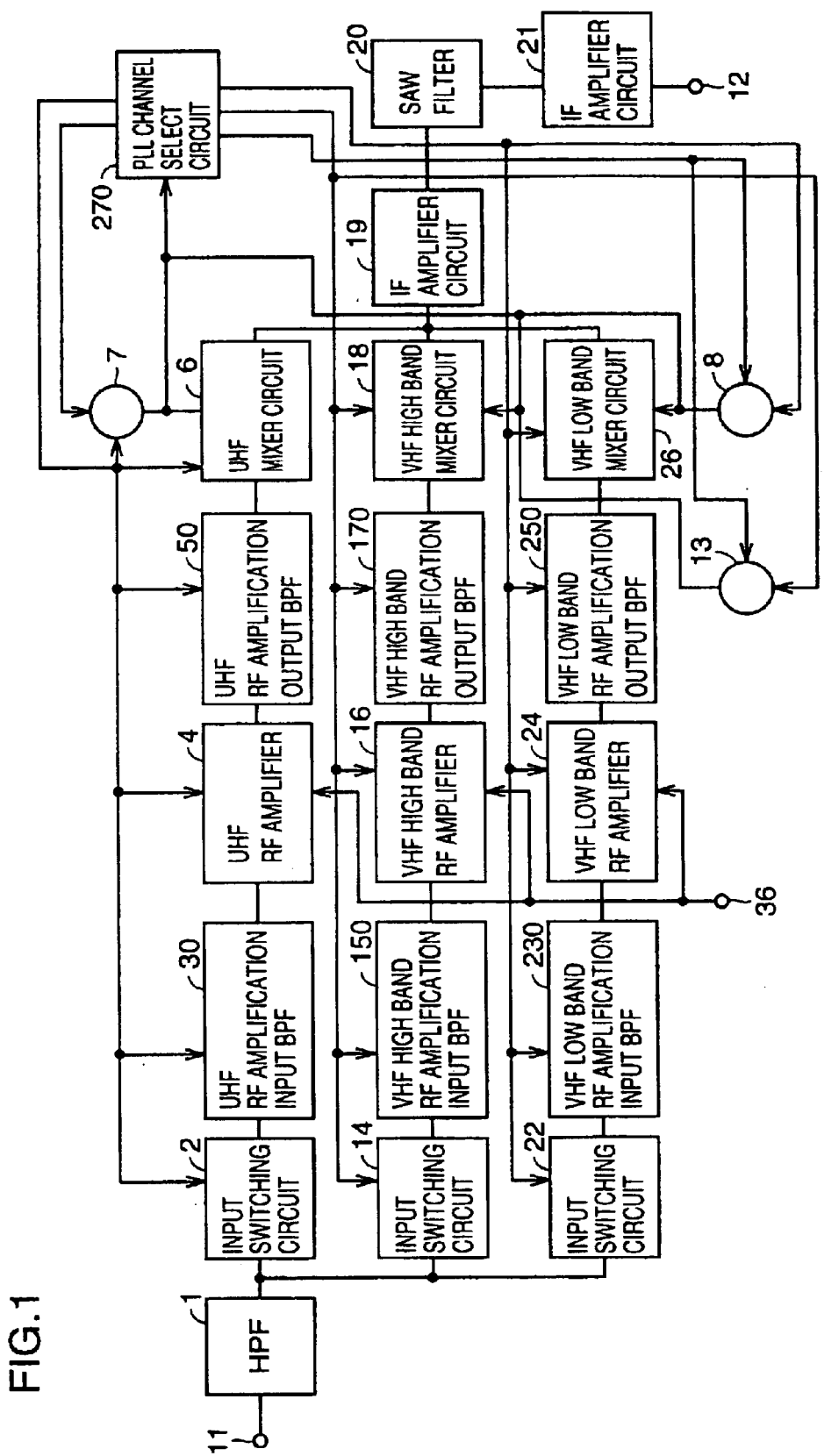
FIG. 1 is a block diagram showing a digital signal receiving tuner according to one embodiment of the present invention.
Figure 4:
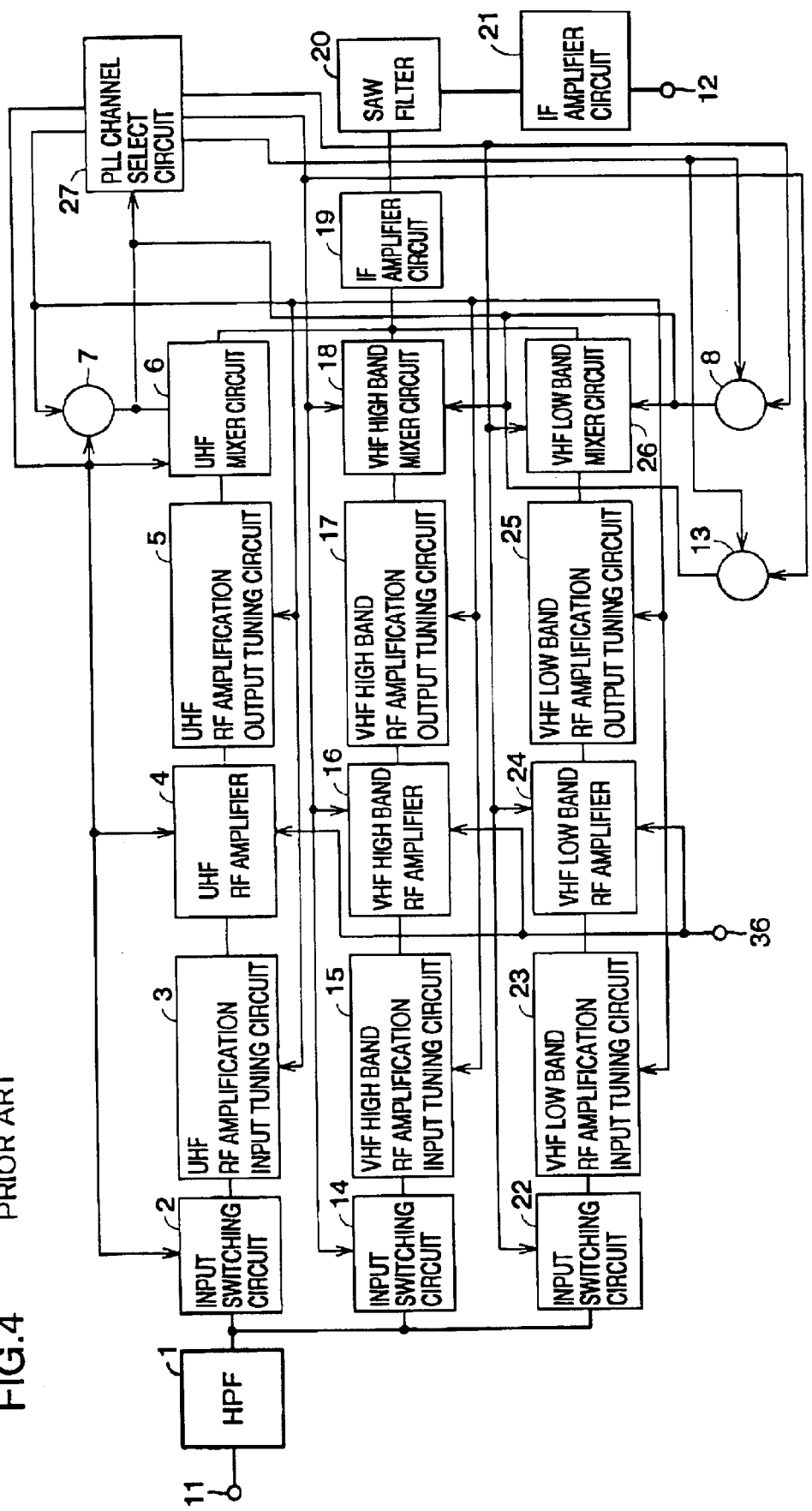
FIG. 4 is a block diagram of a conventional digital signal receiving tuner.

An embodiment shown in FIG. 1 employs RF amplification input BPFs (bandpass filters) 30, 150 and 230 instead of RF amplification input tuning circuits 3, 15 and 23 shown in FIG. 4, employs RF amplification output BPFs 50, 170 and 250 instead of RF amplification output tuning circuits 5, 17 and 25 in FIG. 4, and employs a PLL channel select circuit 270 instead of PLL channel select circuit 27 in FIG. 4. Other structural components of this embodiment are the same as those in FIG. 4.

RF tuning circuits 3, 15, 23, 5, 17 and 25 shown in FIG. 4 use air-core coils for tracking adjustments, make the inductor variable, make local frequency adjustments for VCOs (voltage-controlled oscillators) constituting local oscillator circuits 7, 13 and 8, and make variable the inductor which is a tuning circuit of the RF amplifier circuit, and thus tracking is adjusted.

On the other hand, according to the embodiment shown in FIG. 1, RF amplification tuning circuits are constituted of BPFs 30, 150, 230, 50, 170 and 250 which are separated from VCOs of local oscillator circuits 7, 13 and 8 so that tracking adjustments are unnecessary. Without variable inductor, a coil of the BPF can be used as a fixed inductor.

RF amplification input BPFs and RF amplification output BPFs are used and advantageously, the coil for addressing the problem of shock noise due to vibration is unnecessary. The fixed inductor is used instead of the air-core coil so that influences of frequency change of VCOs in the local oscillator circuits caused by vibration are reduced. Moreover, in order to avoid the shock noise due to the piezoelectric distortion effect of the ceramic capacitor caused by striking, a strontium-based capacitor can be used for a PLL filter to reduce microphonics.

In addition, reduction of the cost is possible since the tracking adjustments and coil are unnecessary. In particular, the reduced cost occupies a great portion of the manufacturing cost of the tuner which is considerably effective.

An operation is now described. A received signal is passed through an HPF 1 to be supplied to input switching circuits 2, 14 and 22 where the signal is switched to any of HIGH BAND, MID BAND and LOW BAND circuitry. HPF 1 is a high-pass filter having an attenuation range from 5 to 46 Mhz and a pass band of 54 MHz or higher. HIGH BAND, MID BAND and LOW BAND correspond respectively to bands of 470–860 MHz, 170–470 MHz and 54–170 MHz. However, the ranges are not particularly limited to these respective ones.

For input switching circuits 2, 14 and 22, a switching method by a general switching diode or a band division method by a filter is used. The method by switching diode is used for the tuner shown in FIG. 1. Each band operates according to a received channel so that other bands do not operate.

For example, when a channel of HIGH BAND is received, HPF 1, input switching circuit 2, RF amplification input BPF 30, RF amplifier 4, RF amplification output BPF 50, mixer circuit 6, local oscillator circuit 7, IF amplifier circuit 19, SAW filter 20, IF amplifier circuit 21 and PLL channel select circuit 270 operate while input switching circuit 14—mixer circuit 18, input switching circuit 22—mixer circuit 26 and local oscillator circuits 13 and 8 stop operating.

Similarly, when a channel of MID BAND is received, HPF 1, input switching circuit 14, RF amplification input BPF 150, RF amplifier 16, RF amplification output BPF 170, mixer circuit 18, local oscillator circuit 13, IF amplifier circuit 19, SAW filter 20, IF amplifier circuit 21 and PLL channel select circuit 270 operate while remaining input switching circuit 2—mixer circuit 6, input switching circuit 22—mixer circuit 26 and local oscillator circuits 7 and 8 stop operating. When a channel of LOW BAND is received, HPF 1, input switching circuit 22—mixer circuit 26, local oscillator circuit 8, IF amplifier circuit 19, SAW filter 20, IF amplifier circuit 21 and PLL channel select circuit 270 operate while input switching circuit 2—mixer circuit 6, local oscillator circuit 7, input switching circuit 22—mixer circuit 26 and local oscillator circuit 8 stop operating.

Operations are carried out successively by transmitting channel select data from a CPU (not shown) to PLL channel select circuit 270, a channel is then selected and simultaneously, the band switching circuit (not shown) operates according to band information. Power supply to circuitry for each band is switched by the band switching circuit and each function is controlled accordingly.

An operation for each band is described below. A received signal passed through HPF 1 is supplied to input switching circuits 2, 14 and 22 and switched to any band circuitry and then supplied to RF amplification input BPFs 30, 150 and 230 where the band is switched. The RF signal is amplified by RF amplifiers 4, 16 and 24 and the received signal is thereafter supplied from RF amplification output BPFs 50, 170 and 250. Mixer circuits 6, 18 and 26 and local oscillator circuits 7, 8 and 13 convert the frequency of the signal supplied from RF amplification output BPFs 50, 170 and 250. The frequency-converted signal is supplied to IF amplifier circuit 19, passed through SAW filter 20, amplified again by IF amplifier circuit 21, and output from an IF output terminal 12. These successive operations are common to the UHF band, VHF HIGH BAND, and VHF LOW BAND.

RF amplification input BPFs 30, 150 and 230 and RF amplification output BPFs 50, 170 and 250 may be constituted of a combination of BPFs and LPFs (low-pass filters). For example, BPFs may be used for the RF amplification input circuits while LPFs may be used for the RF amplification output circuits. In addition, variable image filter or variable image trap for the RF amplification input and output circuits may be constituted of a combination of LPFs and BPFs and a channel may be selected by a PLL.

Figure 2:
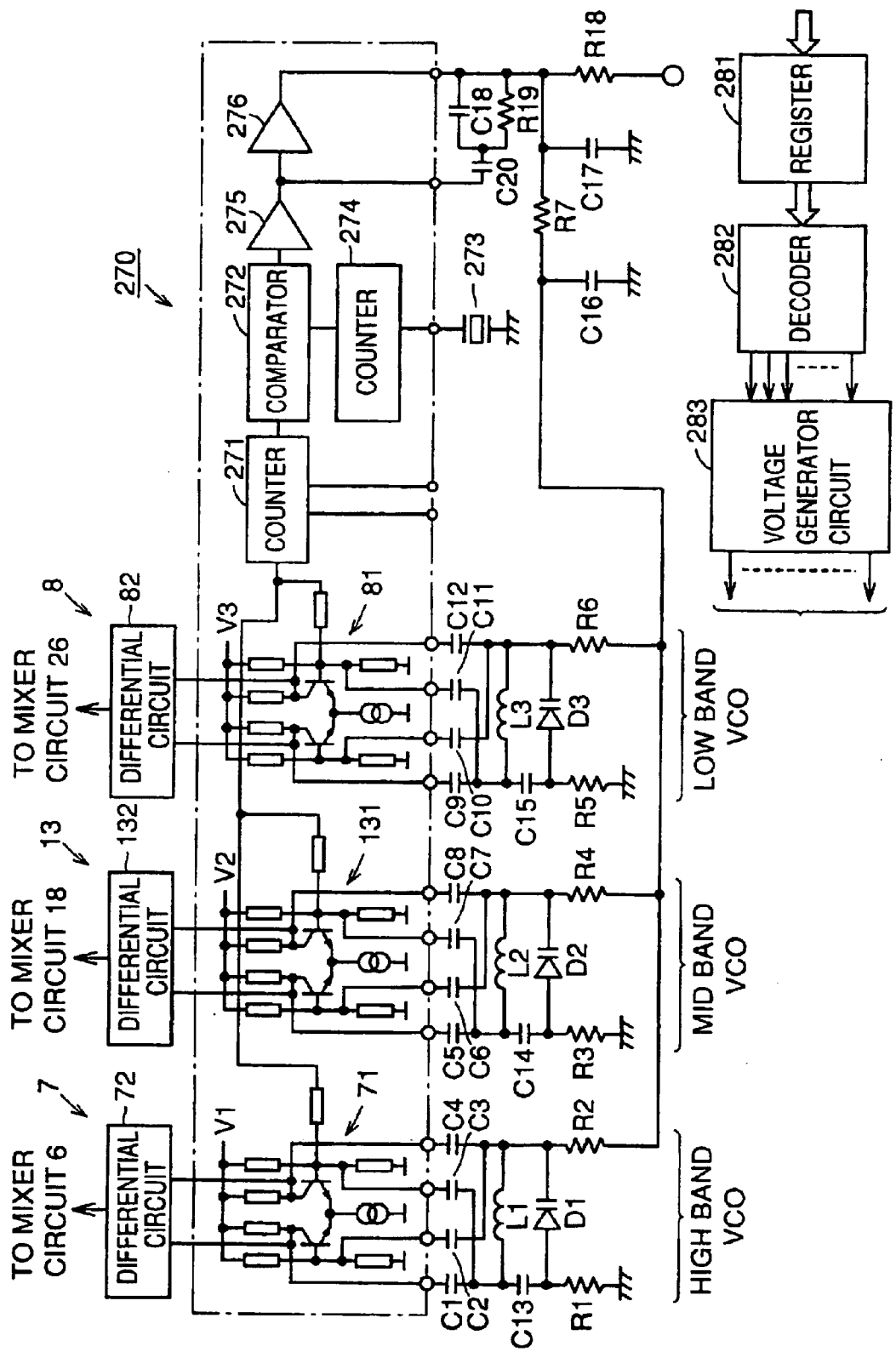
FIG. 2 is a circuit diagram specifically showing local oscillator circuits and a PLL channel select circuit shown in FIG. 1.

FIG. 2 specifically shows the local oscillator circuits and PLL channel select circuit shown in FIG. 1. Referring to FIG. 2, local oscillator circuit 7 includes a VCO (voltage-controlled oscillator) 71 and a differential circuit 72, local oscillator circuit 13 includes a VCO 131 and a differential circuit 132 and local oscillator circuit 8 includes a VCO 81 and a differential circuit 82. Differential circuits 72, 132 and 82 each receive an oscillation output of a corresponding one of VCOs 71, 131 and 81 and supply a local oscillation signal to a corresponding one of mixer circuits 6, 18 and 26.

To respective VCOs 71, 131 and 81, inductors L1, L2 and L3, feedback capacitors C1–C4, C5–C8 and C9–C12, variable-capacitance diodes D1, D2 and D3, variable-capacitance control capacitors C13, C14 and C15, and bias resistors R1 and R2, R3 and R4 and R5 and R6 are connected respectively.

An output of VCOs 71, 131 and 81 each is supplied commonly to a counter 271 where the local oscillation signal is counted and a resultant output is supplied to a comparator 272. Further, an oscillation output of a reference oscillator 273 is supplied to and counted by a counter 274 and a resultant output is supplied to comparator 272.

Comparator 272 compares respective outputs of counters 271 and 274 and a resultant output is supplied to buffer amplifiers 275 and 276. An output of buffer amplifier 276 is converted into a DC voltage by a loop filter formed of capacitors C16, C17, C18 and C20 and resistors R7 and R19 and the DC voltage is fed back to VCOs 71,131 and 81. For capacitors C16,C17, C18 and C20 forming the loop filter, strontium ceramic capacitors are used for addressing the problem of microphonics.

This structure as discussed above is a representative one of the conventional PLL circuit and thus description thereof is not presented here.

PLL channel select circuit 270 includes a register 281, a decoder 282 and a voltage generator circuit 283. Channel select data is supplied from the CPU to register 281, the channel select data is then supplied from register 281 to decoder 282 to be decoded. According to the decoded data, a voltage appropriate for each band is supplied from voltage generator circuit 283. This voltage switches the supply voltage between supply voltage V1 to VCO 71, supply voltage V2 to VCO 131 and supply voltage V3 to VCO 81. The band-switching voltage is supplied to RF amplification input BPFs 30, 150 and 230 and RE amplification output BPFs 50, 170 and 250. According to a corresponding band-switching voltage, appropriate circuits operate.

Figure 3:
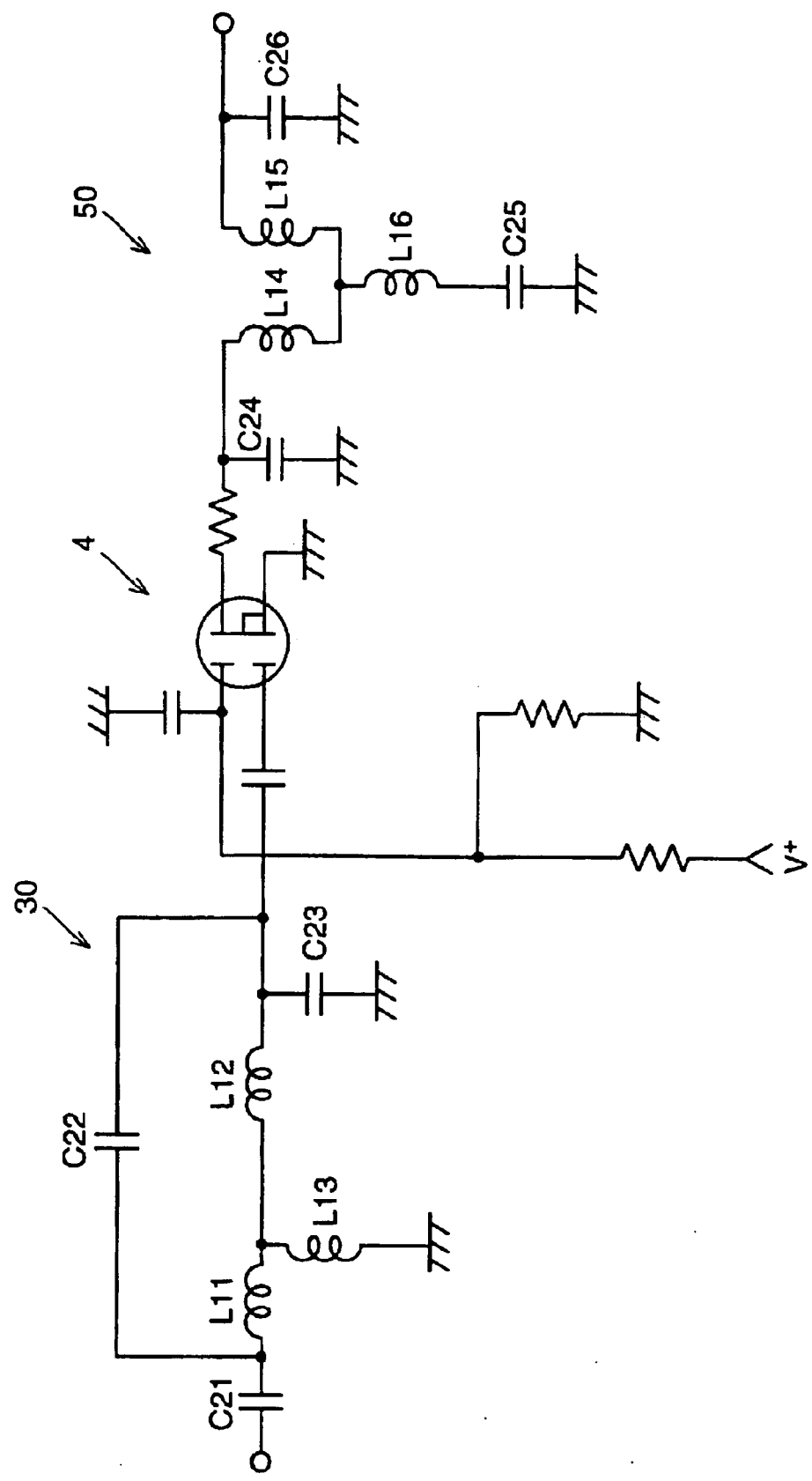
FIG. 3 is a circuit diagram specifically showing an RF amplification input BPF, an RF amplifier and an RF amplification output BPF shown in FIG. 1.

FIG. 3 is a circuit diagram specifically showing the RF amplification input BPF, RF amplifier and RF amplification output BPF shown in FIG. 1. Although FIG. 3 shows circuits for HIGH BAND only, circuits for MID BAND and LOW BAND have similar structures.

Referring to FIG. 3, RF amplification input BPF 30 is constituted to include a series circuit formed of a capacitor C21 and inductors L11 and L12, a capacitor C22 connected in parallel with the series connection of inductors L11 and L12, an inductor L13 connected between the connecting point of inductors L11 and L12 and the ground, and a capacitor C23 connected between the connecting point of inductor L12 and capacitor C22 and the ground.

RF amplification output BPF 50 is structured to include inductors L14 and L15 having respective one ends connected to each other, a capacitor C24 connected between the other end of inductor L14 and the ground, a capacitor C26 connected between the other end of inductor L15 and the ground, and a series circuit formed of an inductor L16 and a capacitor C25 connected between one end of inductors L14 and L15 and the ground. An FET is used for RF amplifier 4.

As heretofore described, according to the embodiment of the present invention, the RF amplification input filter circuits are provided as a preceding stage of the RF amplifier circuits, and the RF amplification output filter circuits are provided on the output side of the RF amplifier circuits. According to a band-switching voltage, the RF amplification input filter circuits and RF amplification output filter circuits operate to selectively output an RF signal of a desired band. Then, the conventional tracking adjustments are unnecessary and thus the variable inductor is also unnecessary. Fixed inductors can thus be used to constitute the filter circuits.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A digital signal receiving tuner receiving digital signals of a plurality of frequency bands, comprising:
    an input circuit receiving said signals of a plurality of frequency bands;
    an input selector circuit receiving the signals from said input circuit to divide the received signals into a plurality of groups according to the frequency bands and selecting and outputting the received signals;
    a radio-frequency amplification input filter circuit supplied with a band-switching voltage for extracting a received signal of a corresponding frequency band from the received signals supplied from said input selector circuit;
    a radio-frequency amplifier circuit for amplifying the received signal supplied from said radio-frequency amplification input filter circuit;
    a radio-frequency amplification output filter circuit supplied with the band-switching voltage for selectively outputting a radio-frequency signal of a predetermined band among radio-frequency signals supplied from said radio-frequency amplifier circuit;
    an oscillator circuit having a phase-locked loop for supplying said band-switching voltage and outputting a local oscillation signal for each frequency band; and
    a mixer circuit mixing the radio-frequency signal selected by said radio-frequency amplification output filter circuit and the local oscillation signal from said oscillator circuit to output an intermediate-frequency signal,
    wherein said oscillator circuit includes
    a voltage-controlled oscillator provided correspondingly to each frequency band for outputting a corresponding local oscillation signal, and
    a phase-locked loop circuit constituting the phase-locked loop together with each voltage-controlled oscillator, and
    wherein said phase-locked loop circuit includes a loop filter formed of a strontium ceramic capacitor.

2. The digital signal receiving tuner according to claim 1, wherein said radio-frequency amplification input filter circuit and said radio-frequency amplification output filter circuit include a bandpass filter.

3. The digital signal receiving tuner according to claim 1, wherein said radio-frequency amplification input filter circuit includes a bandpass filter and said radio-frequency amplification output filter circuit includes a low-pass filter.

4. A tuner for receiving digital signals, comprising:
    an input circuit receiving the signals;
    input selector circuitry supplied with signals from the input circuit for dividing signals from the input circuit into a plurality of frequency bands;
    radio-frequency amplification input filter circuits respectively provided for each of the frequency bands, each radio frequency amplification filter circuit being supplied with a band-switching voltage and filtering the signals supplied thereto from the input selector circuitry;
    radio-frequency amplifier circuits respectively provided for each of the frequency bands, each radio-frequency amplifier circuit amplifying signals supplied thereto from a corresponding one of the radio-frequency amplification input filter circuits;
    radio-frequency amplification output filter circuits respectively provided for each of the frequency bands, each radio-frequency amplifier circuit supplied with the band-switching voltage and filtering the signals supplied thereto from a corresponding one of the radio-frequency amplifier circuits;
    oscillator circuitry comprising a phase-locked loop for supplying the band-switching voltage and outputting local oscillation signals for each of the frequency bands; and
    mixer circuits respectively provided for each of the frequency bands, each of the mixer circuits mixing signals supplied thereto from a corresponding one of the radio-frequency amplification output filter circuits and one of the local oscillation signals to output an intermediate-frequency signal,
    wherein the oscillator circuitry includes
        voltage-controlled oscillators respectively provided for each of the frequency bands, each voltage-controlled oscillator outputting the local oscillation signal for a corresponding one of the frequency bands, and
        a phase-locked loop circuit which together with the voltage-controlled oscillators comprise the phase-locked loop, and
    wherein the phase-locked loop circuit includes a loop filter comprising at least one strontium ceramic capacitor.

5. The tuner according to claim 4, wherein the received signals comprise television signals.

* * * * *

UNITED STATES PATENT AND TRADEMARK OFFICE
CERTIFICATE OF CORRECTION

PATENT NO. : 6,891,575 B2
DATED : May 10, 2005
INVENTOR(S) : Matsuura

It is certified that error appears in the above-identified patent and that said Letters Patent is hereby corrected as shown below:

<u>Title page,</u>
Item [56], References Cited, please insert the following:
-- U.S. PATENT DOCUMENTS 6,160,572   12/2000 Matsuura.....348/11

FOREIGN PATENT DOCUMENTS 07-007687   01/1995 Japan
10/304261   11/1998 Japan
11/284537   10/1999 Japan
2000/152104  05/2000 Japan
2000/152105  05/2000 Japan
2000/307456  11/2000 Japan

OTHER PUBLICATIONS

Office Action in JP 2000-34626 mailed 10/12/2000 and translation thereof --.

Signed and Sealed this

Thirtieth Day of August, 2005

JON W. DUDAS
*Director of the United States Patent and Trademark Office*